(12) United States Patent
Chang et al.

(10) Patent No.: US 6,483,181 B2
(45) Date of Patent: Nov. 19, 2002

(54) MULTI-CHIP PACKAGE

(75) Inventors: Cecil Chang, Pingduan (TW); Jansen Chiu, Kaohsiung (TW)

(73) Assignee: Walton Advanced Electronics Ltd., Kaohsiung (TW)

( * ) Notice: Subject to any disclaimer, the term of this patent is extended or adjusted under 35 U.S.C. 154(b) by 0 days.

(21) Appl. No.: 09/837,255

(22) Filed: Apr. 19, 2001

(65) Prior Publication Data
US 2002/0153601 A1 Oct. 24, 2002

(51) Int. Cl.[7] .............................................. H01L 27/06
(52) U.S. Cl. .................... 257/686; 257/690; 257/696; 257/723; 438/109; 438/123; 361/735; 361/790
(58) Field of Search ................................ 257/668, 676, 257/678, 684, 686, 690, 692, 693, 696, 700, 707, 724, 723, 737, 777, 779, 782–784, 786, 792; 438/106, 107, 109, 112, 118, 123, 124–127; 361/735, 790

(56) References Cited

U.S. PATENT DOCUMENTS

| | | | |
|---|---|---|---|
| 5,366,933 A | 11/1994 | Golwalkar et al. ......... 437/215 |
| 6,087,718 A | * 7/2000 | Cho | |
| 6,118,176 A | 9/2000 | Tao et al. ................. 257/676 |

* cited by examiner

Primary Examiner—Steven Loke
Assistant Examiner—Patricia M. Costanzo
(74) Attorney, Agent, or Firm—Trowell Law Office PLLC

(57) ABSTRACT

A multi-chip package with a LOC lead frame is disclosed. Such a LOC lead frame has a plurality of leads, with each lead being divided into an inner portion and an outer connecting portion. A first tape adhering under the inner portions of the leads fastens the first chip and the first bonding wires electrically connect the first chip with the inner portions. A second tape adhering upon the inner portions of the leads fastens the second chip and the second bonding wires electrically connect the second chip with the inner portions. The second tape has a thickness so as to avoid the first bonding wires touching the second chip. The multi-chip package enables to package at least two chips by a LOC lead frame without turnover action during wire-bonding.

6 Claims, 3 Drawing Sheets

MULTI-CHIP PACKAGE

FIELD OF THE INVENTION

The present invention relates to a multi-chip package with a LOC lead frame, in particular about the type of multi-chip package with thick tapes sticking to the LOC lead frame.

DESCRIPTIONS OF THE PRIOR ART

Figure 1:
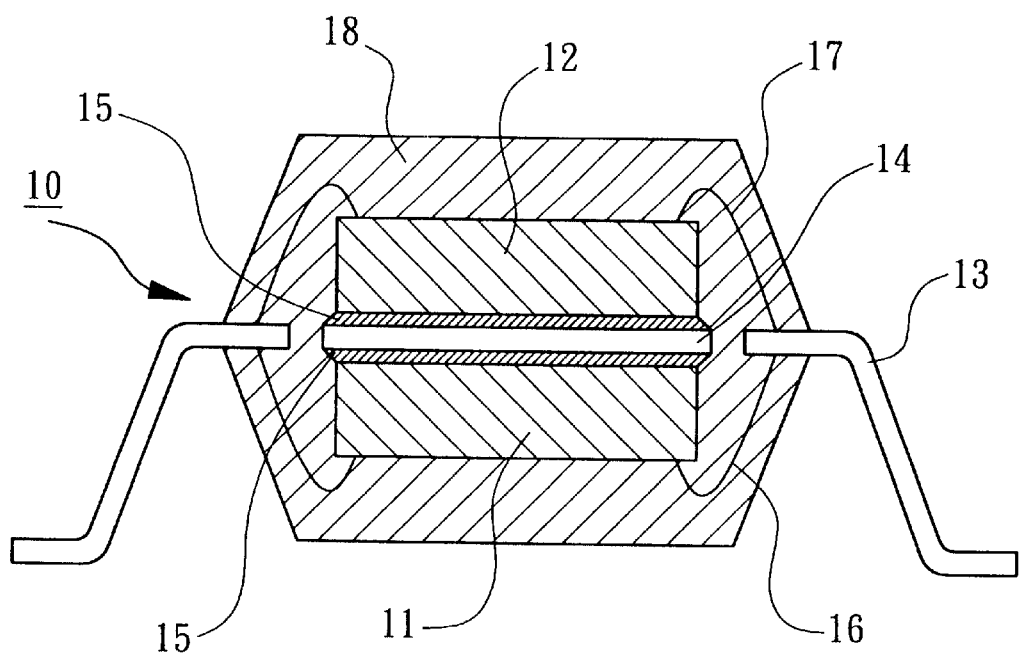

In the past, a common making process of semiconductor devices use a lead frame to support and electrically connect to a semiconductor chip, and then seals the chip with a package body. To achieve higher performance and larger memory capacity, the semiconductor chip has become smaller and more accurate. An idea of stacking and sealing a number of semiconductor chips in the package body during packaging process has also been proposed. A manufacturing process of a multi-chip package has been claimed in the U.S. Pat. No. 5,366,933. As shown in FIG. 1, the multi-chip package 10 is used. to seal the bottom chip 11 and the upper chip 12, wherein it comprises a bottom chip 11, an upper chip 12, a lead frame, a plurality of bonding wires 16 and 17, and a package body 18. This general type of lead frame comprises a plurality of leads 13 and a dice pad 14. Adhesive films 15 are applied to stick the bottom chip 11 and the upper chip 12 respectively to the bottom and the upper surface of the dice pad 14. A plurality of bonding wires 16 are further used to connect the bottom chip 11 and the leads 13 by wire-bonding technique, while a plurality of bonding wires 17 are used to connect the upper chip 12 and the leads 13 by wire-bonding technique as well. Because the bottom chip 11 and the upper chip 12 are adhesively stuck to the dice pad 14 with their back surface, an overturn action of the dual chip assembly is necessary during the wire-bonding process. To avoid compressing or scratching the bonding wires 16 during the second wire-bonding process, the manufacture processes of this multi-chip package 10 are in the order of sticking the bottom chip 11, forming bonding wires 16 to connect the bottom chip 11 and the lead frame, first time of molding and curing. (the bottom part of the package body 18), sticking the upper chip 12, forming bonding wires 17 to connect the upper chip 12 and the lead frame, second time of molding and curing (the upper part of the package body 18). Nevertheless, such processes are not widely accepted under taking manufacturing efficiency and cost of molds development into consideration.

Another type of multi-chip package is claimed in the U.S. Pat. No. 6,118,176. A LOC lead frame is used to support the upper chip and the bottom chip. The so-called LOC lead frame is the type of lead-on-chip lead frame for short. That is, the leads of the lead frame are extended on the chip for electrical connection and support of the chip without using the dice pad of the lead frame. Such a multi-chip package comprises a dual chip assembly with back-to-back sticking configuration, while the leads of the LOC lead frame are extend on the bottom surface of the bottom chip and fixed with an adhesive film. A circuit board is sticking.:on the upper surface of the upper chip, so as to enable the bonding wires to electrically connect the upper chip and the circuit board, as well as the circuit board and the leads. Likewise, the manufacture of such a multi-chip package must also involve an overturn action for wire bonding, the bonding wires on the bottom chip, however may be scratched during the wire-bonding process of the upper chip.

SUMMARY OF THE INVENTION

The major object of the present invention: is to provide a multi-chip package, which uses a LOC lead frame and a plurality of tapes to integrate a plurality of vertically stacked chips. With the thickness of the corresponding tape underneath the chip, such a package can avoid compressing the bonding wires beneath the chip, therefore no overturn action is necessary while packaging the upper and bottom chips.

In accordance with the multi-chip package of the present invention, it mainly comprises a LOC lead frame, the first chip, the second chip and a package body. Such a LOC lead frame possesses a plurality of leads, and can be from inside to outside divided into the first inner portion, the second inner portion and the outer connecting portion, where the first inner portion forms a downset. The first chip is located beneath the first inner portion of the plurality of leads, and its top surface is sticking to the first inner portion of the leads in the LOC lead frame by the first tape. The top surface of the first chip possesses a plurality of chip pads to enable a plurality of the first bonding wire to electrically connect the chip pads of the first chip and the first inner portion. of the corresponding leads. The second chip is located above the plurality of leads of the first inner portion, and its bottom surface is sticking to the first inner portion of the leads in the lead frame by the second tape. The thickness of the second tape can avoid the first bonding wire contacting the bottom surface of the second chip. The top surface of the second chip possesses a plurality of chip pads to enable the plurality of bonding wires to electrically connect the chip pads of the second chip and the second inner portion of the corresponding leads. The package body packages the first chip, the second chip, the boding wires, and the first and the second inner portion of the lead frame.

BRIEF DESCRIPTIONS OF THE DRAWING

FIG. 1: The cross-sectional view of the double-chip package in U.S. Pat. No. 5,366,933.

Figure 2:
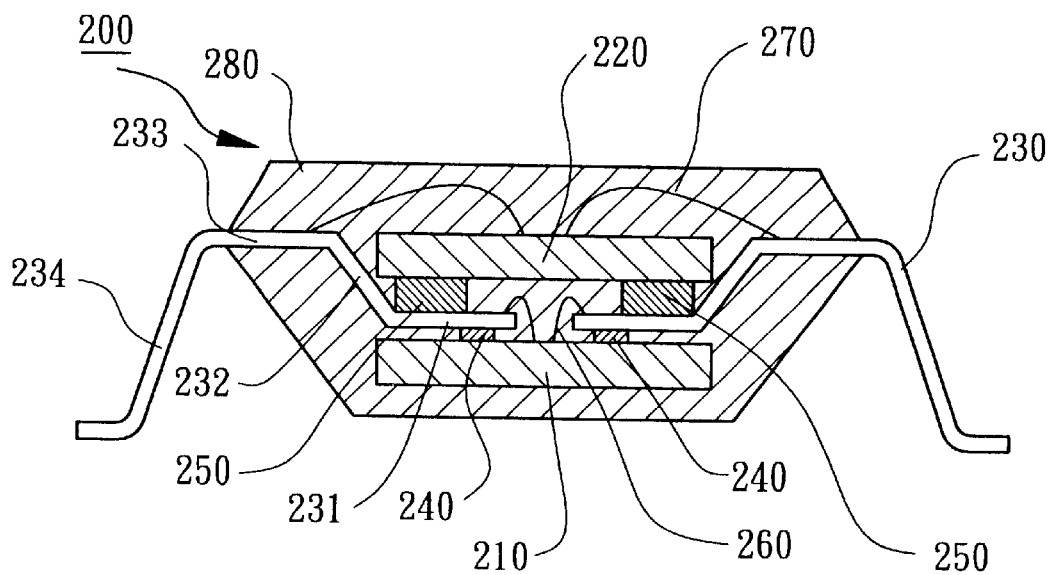

FIG. 2: The cross-sectional view of the multi-chip package of the present invention.

Figure 3:
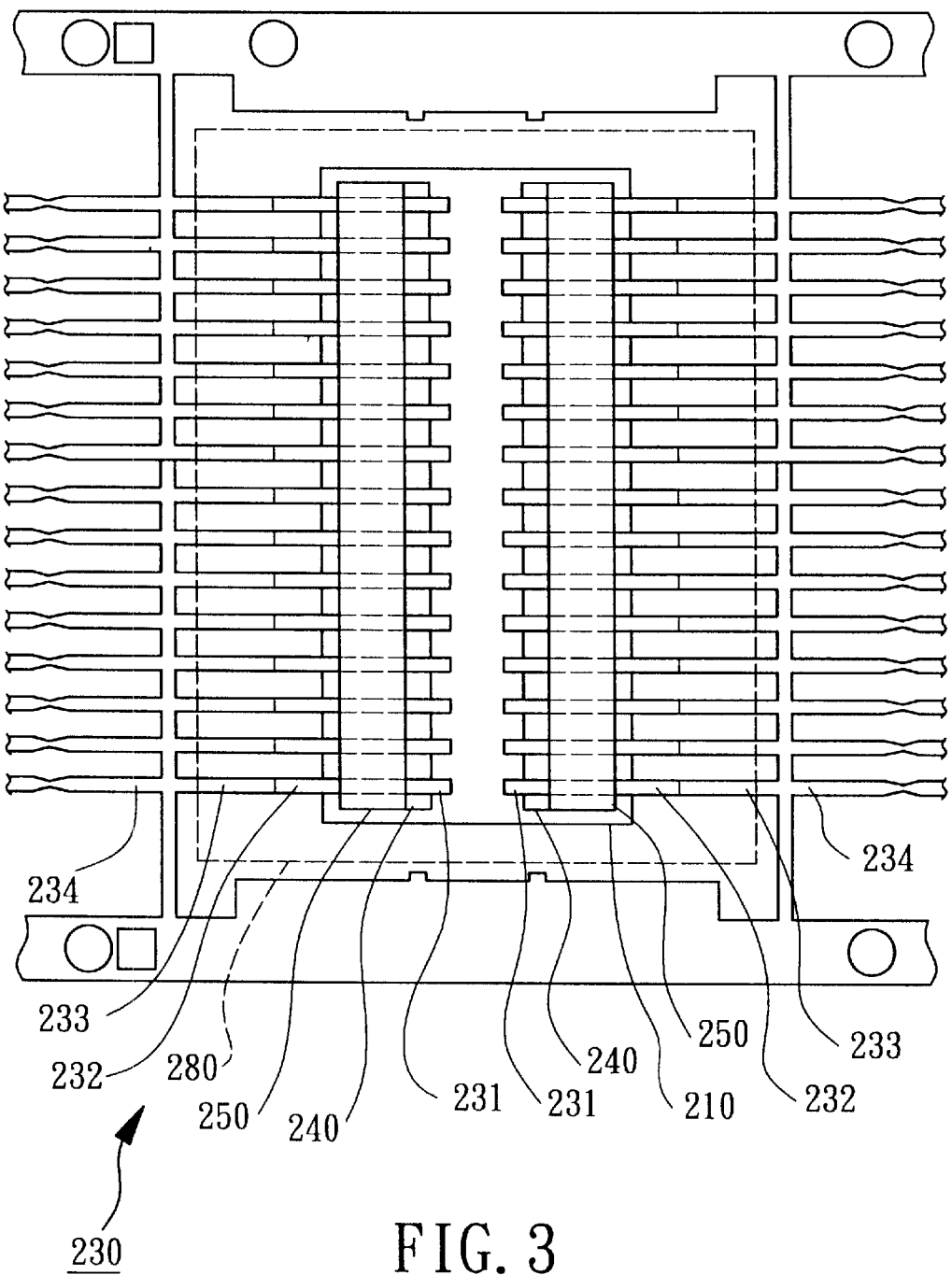

FIG. 3: The top view of the lead frame in accordance with the multi-chip package of the present invention.

Figure 4:
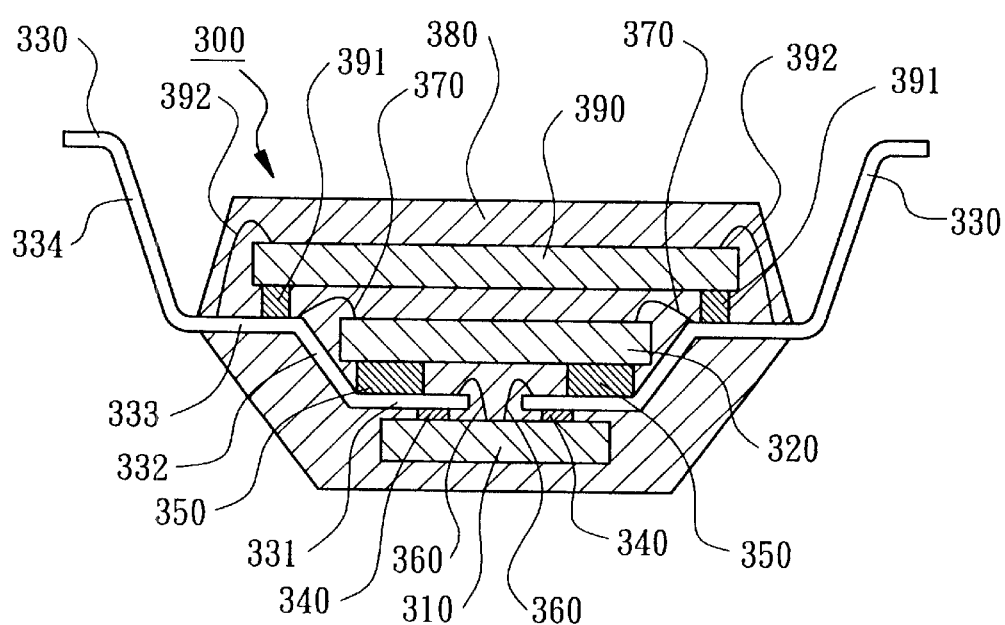

FIG. 4: The cross-sectional view of another multi-chip package of the present invention.

DETAILED DESCRIPTIONS OF THE PRESENT INVENTION

Please refer to the attached drawings, the embodiments hereafter are listed to explain the present invention.

FIGS. 2 and 3 illustrates the first embodiment of the present invention, where a multi-chip package 200 comprises a LOC lead frame, the first chip 210, the second chip 220 and a package body 280.

As shown in FIGS. 2 and 3, the LOC lead frame is a type of 'Lead-On-Chip' lead frame, which can be made of a thin board in steel or copper by common stamping or etching methods. Such a LOC lead frame possesses a plurality of leads 230, with each lead 230 from inside to outside being divided into the first inner portion 231, the bending portion 232, the second inner portion 233 and the outer connecting portion 234, where the first inner portion 231, the bending portion 232 and the second inner portion 233 are packaged in the package body 280. The tilting of the bending portion 232 causes the first inner portion 231 to form a downset, which serves to contain the second chip 220. The first inner portion 231 is used to stick the first chip 210 and the second chip 220, and electrically connect the first chip 210. The second inner portion 233 is used to electrically connect the second chip 220, while the outer connecting portion 234 serves as the outer connectors of the multi-chip package 200.

The first chip 210 is sticking beneath the first inner portion 231 of the above leads 230. The top surface of the first chip 210 is sticking to the first inner portion 231 of the leads 230 by at least one first tape made of insulating material, such as polyimide. The top surface of the first chip 210 commonly; possesses a plurality of bonding pads and integrated circuit elements (not illustrated in figures). The first chip 210 can be memory chips like DRAM (Dynamic Random Access Memory), SRAM (Static Random Access Memory) and flash memory, microprocessor, or chips with logic functions. Besides, the electricity connection between the first chip 210 and the lead frame is achieved by a plurality of first bonding wires 260, made of gold or copper, connecting the bonding pads of the first chip 210 (the top surface) and the first inner portion 231 of the corresponding leads 230 in the lead frame using wire-bonding technique.

The second chip 220 can be the same as the first chip 210 or any other functional chips, and the two chips are preferred to be of the same size. The second chip 220 is sticking to the top of the supporting portion 233 of the above leads 230. The second chip 220 is sticking above the first inner portion 231 of the above leads 230. The bottom surface of the second chip 220 is sticking to the first inner portion 231 of the leads 230 by at least a second tape made of insulating material, such as polyimide. The top surface of the second chip 220 commonly possesses a plurality of bonding pads and integrated circuit elements (not illustrated in figures). It connects the bonding pads of the second chip 220 and the second inner portion 233 of the corresponding leads 230 with a plurality of the second bonding wires 270 by the use of the wire-bonding technique. The thickness of the second tape 250 causes the second chip 220 to be higher than the first inner portion 231, such that the first bonding wire 260 will not contact the bottom surface of the second chip 220. The thickness of the second tape 250 is preferred to be larger than that of the first tape 240. Besides, the package body 280 of the multi-chip package 200 which is a thermosetting compound seals the first chip 210, the second chip 220, the first tape 240, the second tape 250, the bonding wires 260, 270, and the first inner portion 231, the bending portion 232, and the second bending portion 233 but to expose the outer connecting portion 234 of the lead 230, so that to protect the above double-chip structure. Therefore, the multi-chip package 200 of the present invention is capable of packaging at least two chips, while the use of the LOC lead frame makes the two chips parallel with each other in a vertical direction, so as to decrease the footprint of the multi-chip package 200. In the meantime, since the bonding pads of the first chip 210 and the bottom chip 220 are facing the same direction (upper surface), the steps of the manufacturing process are in the sequences of sticking the first chip 210, wire-bonding the first chip 210, sticking the second chip 220, wire-bonding the second chip 220, and molding. The thickness of the second tape 250 can avoid the second chip 220 compressing the bonding wires 260 on the first chip 210. The advantage is that no turnover action is required during manufacturing process.

The second embodiment is listed to further demonstrate that the multi-chip package of the present invention is not limited to the number and the size of the packaging chip. As shown in FIG. 4, such a multi-chip package 300 can package three chips in different sizes. It mainly includes a LOC lead frame, a first chip 310, a second chip 320, a third chip 390 and a package body 380. The LOC lead frame possesses a plurality of leads 330, with each lead 330 being divided into a first inner portion 331, a bending portion 332, a second inner portion 333 and an outer connecting portion 334. The tilt of the bending portion 332 causes the first inner portion 331 to form a downset, so as to contain the second chip 320. The first inner portion 331 is used to stick the first chip 310 and the second chip 320, and also serves to electrically connect to the first chip 310. The second inner portion 333 is used to stick the third chip 390 and electrically connect the second chip 320 and the third chip 390. the outer connecting portion 334 is used as the outer connectors of the multi-chip package 300.

The first chip 310 is sticking beneath the first inner portion 331 of the above leads 330. The top surface of the first chip 310 is sticking to the first inner portion 331 of the leads 330 with at least an insulating double-sided first tape 340 made of materials like polyimide. The top surface of the first chip 310 is sticking to the first inner portion 331 of the leads 330 and commonly has a plurality of bonding pads. A plurality of first bonding wires 360 connect the bonding pads of the first chip 310 (the top surface) to the first inner portion 331 of the corresponding leads of the lead frame.

The second chip 320 is sticking above the first inner portion 331 of the leads 330. The bottom surface of the second chip 320 is sticking to the inner portion 331 of the leads 330 with at least an insulating second tape 350.; The second chip 320 commonly possesses a plurality of bonding pads (not illustrated: in drawings) and uses a plurality of second bonding wires 370 to electrically connect the bonding pads of the second chip 320 to the second inner portion 333 of the corresponding leads 330 of the lead frame. The thickness of the second tape 350 causes the second chip 320 to be higher than the first inner portion 331, so that the first bonding wire 360 will not contact the bottom surface of the second chip 320. The third chip 390 is sticking to the top of the second inner portion 333 of the above leads 330. The bottom surface of the third chip 390 is sticking to the second inner portion 333 of the leads 330 with at least an insulating third tape 391. The third chip 390 commonly has a plurality of bonding pads on its top surface (not illustrated in drawings) and uses a plurality of third bonding wires 392 to electrically connect the bonding pads 390 of the third chip to the inner connecting portion 333 of the corresponding leads 330 of the lead frame. The thickness of the third tape 391 causes the third chip 390 to be higher than the second inner portion 333, so that the second bonding wires 370 will not contact the bottom surface of the third chip 390. Furthermore, the package body 380 of the multi-chip package 300 packages the first chip 310, the second chip 320, the third chip 390, the first tape 340, the second tape 350, bonding wires 360, 370, 392 and the first inner portion 331, the bending portion 332 and the second inner portion 333 of the lead frame, with outer connecting portion 334 exposed outside. The structure can protect the above multi-chip package.

The protection scope of the present invention must refer to the appended claim. Any change or modification, by anyone familiar the technique, without departing from the spirit of the present invention are within the scope of the claims.

What is claimed is:

1. A multi-chip package comprising:
   a LOC lead frame having a plurality of leads, with each lead including a first inner portion, a second inner portion and an outer connecting portion, wherein a downset is formed between the first inner portions and the second inner portions;
   a first chip located beneath the first inner portions of the leads and having a plurality of bonding pads on a top surface;

a first tape sticking the top surface of the first chip to the first inner portions of the leads;

a plurality of first bonding wires electrically connecting the bonding pads of the first chip and the first inner portions of the corresponding leads;

a second chip located on top of the first inner portions of the leads and having a plurality of bonding pads on a top surface;

a second tape sticking a bottom surface of the second chip to the first inner portions of the leads in the LOC lead frame, the second tape having a thickness so as to avoid the first bonding wires contacting the bottom surface of the second chip;

a plurality of second bonding wires electrically connecting the bonding pads of the second chip and the second inner portions of the corresponding leads;

a third chip located above the second inner portions of the leads and having a plurality of bonding pads on a top surface;

a third tape sticking a bottom surface of the third chip to the second inner portions of the leads, the third tape having a thickness so as to avoid the second bonding wires contacting the bottom surface of the third chip; and a package body sealing the first chip, the second chip, the third chip, the bonding wires and the first and second inner portions of the leads.

2. A multi-chip package comprising:

a LOC lead frame having a plurality of leads, with each lead including a first inner portion, a second inner portion and an outer connecting portion, wherein a downset is formed between the first inner portions and the second inner portions;

a first chip located beneath the first inner portions of the leads and having a plurality of bonding pads on a top surface;

a first tape sticking the top surface of the first chip to the first inner portions of the leads;

a plurality of first bonding wires electrically connecting the bonding pads of the first chip and the first inner portions of the corresponding leads;

a second chip located on top of the first inner portions of the leads and having a plurality of bonding pads on a top surface;

a second tape sticking a bottom surface of the second chip to the first inner portions of the leads in the LOC lead frame, the second tape having a thickness so as to avoid the first bonding wires contacting the bottom surface of the second chip;

a plurality of second bonding wires electrically connecting the bonding pads of the second chip and the second inner portions of the corresponding leads; and a package body sealing the first chip, the second chip, the bonding wires and the first and second inner portions of the leads;

wherein the downset between the first inner portions and the second inner portions has a vertical height of not less than combined thicknesses of the second chip and the second tape.

3. The multi-chip package in accordance with claim 2, wherein the bonding pads of the first chip are centrally located on the top surface thereof, and the bonding pads of the second chip are centrally located on the top surface thereof.

4. The multi-chip package in accordance with claim 2, wherein a thickness of the second tape is thicker than a thickness of the first tape.

5. The multi-chip package in accordance with claim 2, wherein the second tape is made of polyimide.

6. The multi-chip package in accordance with claim 2, further comprising a third chip and a third tape, the third chip located above the second inner portions of the leads and having a plurality of bonding pads on a top surface, the third tape sticking a bottom surface of the third chip to the second inner portions of the leads, the third tape having a thickness so as to avoid the second bonding wires contacting the bottom surface of the third chip.

* * * * *